United States Patent [19]

Greer, Jr. et al.

[11] Patent Number: 4,796,229

[45] Date of Patent: Jan. 3, 1989

[54] WRITABLE LOGIC ARRAY

[75] Inventors: W. T. Greer, Jr.; Frank L. Laczko, both of Plano, Tex.

[73] Assignee: Texas Instruments Incorporated, Dallas, Tex.

[21] Appl. No.: 883,415

[22] Filed: Jul. 8, 1986

[51] Int. Cl.[4] .............................................. G11C 7/00
[52] U.S. Cl. .................................... 365/189; 364/716; 307/465
[58] Field of Search ................ 364/716; 307/465, 468; 340/825.83; 365/189, 230, 233, 94, 96

[56] References Cited

U.S. PATENT DOCUMENTS 4,488,230  12/1984  Harrison .............................. 364/200

Primary Examiner—Joseph A. Popek
Attorney, Agent, or Firm—George L. Craig; James T. Comfort; Melvin Sharp

[57] ABSTRACT

A writable logic array includes a first matrix (12,38) of gate elements. Program lines (16) connect the first array (12,38) with a second matrix (18,40) of gate elements. A plurality of switches (22), one for each program line (16), selectively couple or decouple the program lines (16) to the second matrix (18,40). Switches (22) are in turn controlled by a volatile memory (32), into which instructions may be written at the time the system into which the array is incorporated is booted up.

18 Claims, 1 Drawing Sheet

WRITABLE LOGIC ARRAY

TECHNICAL FIELD OF THE INVENTION

The present invention relates in general to logic circuits, and more particularly to programmable logic arrays.

BACKGROUND OF THE INVENTION

It is often desirable to modify system logic because of a mistake or improper design of the logic. Previously developed techniques for programming logic have included the use of fuses which may be blown to affect the interconnection of the logic. Examples of circuits using fuses are programmable read only memories (PROMs) and field programmable logic arrays (EPLAs). Mask-programmable logic arrays (MPLAs) are programmed at the manufacturing facility by designing connections between the gates. All of these devices share the characteristic of being able to be programmed only once. EPLAs and PROMs may be modified by blowing fuses in the program lines between component matrices thereof, but again this can be done only once. Furthermore, circuits which utilize the blowing of fuses require a source of programming current that is many times that of operational current, thereby making it difficult to redesign the circuits in the field.

Other techniques for the redesign or reprogramming of logic circuits have utilized electrically alterable circuits that must be programmed with special programmers and then erased with ultraviolet light. Such circuits, termed erasable and programmable read only memories (EPROMs), require substantial time and complexity for programming. For example, programming times for EPROMs generally range in the order of seconds per programmed connection. EPROMs are also disadvantageous in that they may be reprogrammed only a few times, and are difficult to reprogram in the field.

In view of the foregoing, a need has existed in the industry for a programmable logic array whose preprogrammed functions can be easily varied in the field after the array is operated, and it is determined that changes or modifications are needed. A further need has existed for a field programmable logic array with preprogrammed functions that can be easily varied an indefinite number of times. Finally, a need has arisen for a field-programmable logic circuit that can be easily programmed without the aid of special equipment.

SUMMARY OF THE INVENTION

The writable logic array of the invention comprises a first matrix having a plurality of gate elements that are permanently programmed to perform a first set of logic functions. The outputs of these logic functions are coupled to a second permanently programmed matrix by a plurality of program lines. The second logic matrix uses the program lines as its inputs and performs a second set of logic functions on them to produce outputs appearing on a plurality of output lines. The program lines between the first and second matrices are selectively enabled by respective switches. Each switch is controlled by a cell of a volatile memory.

The present invention provides a field-writable logic array having at least the following advantages over the prior art. The array's logic functions can be varied an indefinite number of times and can be at least partially programmed very quickly during system boot-up immediately before or even during its operation. The volatile memory may be loaded during system boot-up to configure the logic array to perform any of a plurality of logic functions. Further, the logic array may be reconfigured at any time by reprogramming the volatile memory. In a preferred embodiment, configuration of the logic array of the invention takes approximately 25 nanoseconds per program line as opposed to whole seconds for conventional fuse-blowing programming techniques.

BRIEF DESCRIPTION OF THE DRAWINGS

A more complete understanding of the invention may be had by reference to the following detailed description when taken in conjunction with the accompanying drawings wherein.

DETAILED DESCRIPTION

Figure 1:
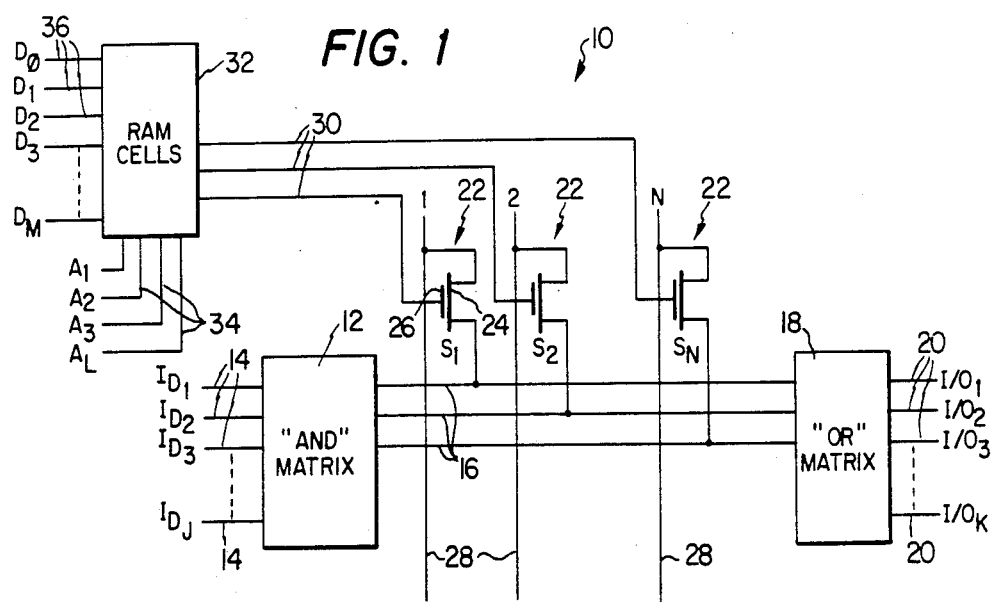
FIG. 1 is an electrical schematic diagram of a first embodiment of the invention, incorporating a variable AND matrix and a fixed OR matrix.

Referring now to the drawings, wherein like reference characters designate like or corresponding parts, FIG. 1 shows a first embodiment of a writable logic array indicated generally by numeral 10. The logic array 10 is preferably formed on a single semiconductor chip and comprises a programmed matrix of AND gates 12. Matrix 12 is permanently programmed in the case of a fuse- or mask-programmable matrix. AND matrix 12 includes a plurality of digital input lines 14 used as inputs to various preprogrammed AND logic functions within the matrix. The outputs of the preprogrammed AND functions appear on respective ones of a plurality of program lines 16. For an example of an AND matrix used as a component of a logic array, see W-Triebel and A-thru, *Handbook of Semiconductor and Bubble Memories,* pp. 224–227 (1982).

Program lines 16 are connected to a preprogrammed matrix of OR gates 18. The data communicated on program lines 16 serve as the inputs for a plurality of preprogrammed OR functions within OR matrix 18. The results of the combined AND and OR functions appear as output signal $I/O_1$–$I/O_K$ on a plurality of output lines 20. In PLAs, the output lines 20 may serve as the inputs of other matrices, such as a NOR matrix. Examples of OR and NOR matrices of logic arrays can be formed in W-Triebel and A-thru, *Handbook of Semiconductor and Bubble Memories,* pp. 227–231 (1982).

Program lines 16 can be selectively coupled or decoupled from OR matrix 18 by a plurality of switches, which can take the form of switching transistors 22. Each switching transistor 22 is preferably a field-effect transistor having a current path 24 connecting a source and a drain. A control electrode 26 determines whether current path 24 is conductive. One end of the current path 24, either the source or the drain, of each switching transistor 22 is connected to a respective program line 16. The other end is connected to ground via a ground line 28.

The control electrode 26 of each transistor 22 is connected to a respective random access memory or RAM output line 30. Each RAM output line 30 is coupled through intervening conventional circuitry to a respective RAM cell within a RAM unit 32. The cells in RAM unit 32 are addressed by L address lines 34, and the cells are loaded with "1" or "0" bits through M data lines 36.

As persons skilled in the art will appreciate, RAM unit 32 has been greatly simplified for purposes of clarity. In a typical configuration, RAM unit 32 will include a row decoder and a column decoder to decode the address appearing on lines 34. L, the number of data input lines 36, may range from one up to eight, sixteen or more depending on the architecture of the random access array. RAM unit 32 will also generally include column I/O circuits, input data control circuitry, and a plurality of control lines including a read/write control line. Further architectural details can be had by referring to W-Triebel and A-thru, *Handbook of Semiconductor and Bubble Memories*, pp. 111–166 (1982).

Data will be output from the random access array M bits at a time, with M again being dependent on the array's architecture. The output can appear on an M-bit data bus, to be stored in one of $2^L$ successive D-type latches. The latch receiving a particular M-bit data word can be chosen by a write counter, which will cause the data to be written to the latches in order. $N = 2^L \times M$ bits will then be available in the latches to simultaneously energize or deenergize N electrodes 26.

As an example, let RAM unit 32 incorporate a 1024 bit static RAM that is organized as 256 4-bit words. For this RAM, M=4 and L=8. The data is output 4 bits at a time into each of 256 4-bit latches. Each latch has four output lines 30, so that the number of electrodes 26 and therefore program lines 16 that can be controlled is 1024.

In order to obtain optimum programming time, switching transistors 22 may be formed by complementary metal-oxide-semiconductor (CMOS) technology. Using CMOS switching transistors, each program line may be configured within 25 to 35 nanoseconds.

Switching transistors 22 may however also be formed with NMOS or PMOS technology. Further, switches 22 can take the form of flip flops. RAM 32 is preferably a static RAM, but can also be a dynamic RAM.

In operation, program lines 16 are selectively enabled to determine which of a plurality of AND functions will be ORed together by OR matrix 18. Upon startup of the system into which the invention is incorporated, software embodying the configuration instructions is uploaded into RAM 32 through data input lines 36. Each cell in RAM 32 will then contain either a "1" bit or a "0" bit. These "1" or "0" states will appear on respective RAM cell output lines 30 through the action of conventional circuitry such as that described above as incorporated within RAM unit 32. Depending on whether a "1" state or a "0" state appears on a particular line 30, a respective control electrode 26 may be energized. In this condition, any information on a respective program line 16 will be shunted through current path 24 to ground line 28. On the other hand, for any switching transistor 22 having a control electrode 26 that is not energized, the respective program line 16 is enabled to transmit information from AND matrix 12 to OR matrix 18.

Consequently, the logic functions configured by array 10, as they appear at output lines 20, can be altered by disabling one or more inputs to matrix 18, or by enabling one or more of the program lines previously disabled.

In addition to its relative programming speed and ease, one of the principal advantages of the invention is that it is reprogrammable an indefinite number of times. The array of the invention is configured upon each boot-up of the system, and can be almost instantly reconfigured by writing new data into RAM 32. Programming defects, which may occur in PROMs and PLAs, can often be corrected by the software with which RAM 32 is loaded.

Several types of matrices may be coupled by lines 16 and transistors 22. Further, the serial connection of several matrices in a logic array can allow for additional modification, as transistors 22 can be provided to enable or disable each program line among the matrices. FIG. 1 illustrates in particular an embodiment whereby a "variable" AND matrix is configured in relation to a "fixed" OR matrix. The AND matrix is made variable by the selective enabling of program lines 16. Although AND and OR matrices are illustrated, matrices 12 and 18 can also be comprised of other product or summing gates, such as NAND, NOR or XOR gates, or even flipflop circuits. Further, although programmable logic arrays are generally divided into homogenous matrices 12 and 18 as illustrated, the invention may also be applied to configure program lines from one matrix having mixed gate elements to another matrix of mixed elements.

Figure 2:
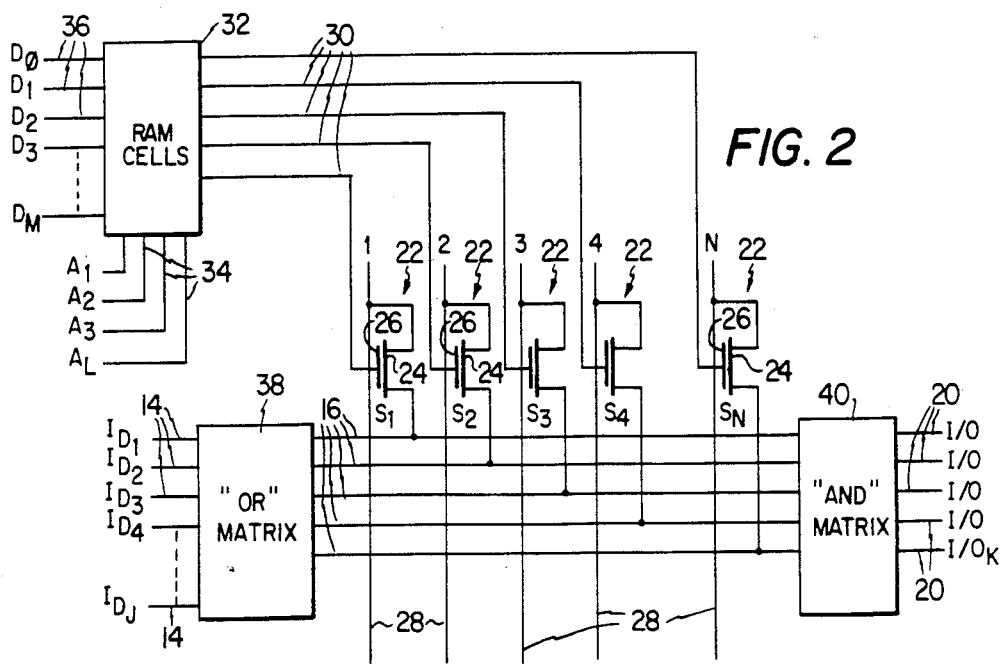
FIG. 2 is an electrical schematic diagram of the invention in a second embodiment, incorporating a variable OR matrix and a fixed AND matrix.

FIG. 2 illustrates another application of the invention. In this embodiment, program lines 16 connect a permanently programmed OR matrix 38 with a permanently programmed AND matrix 40. Input lines 14 serve as inputs to various functions produced by combinations of OR gates in matrix 38. The outputs of these various OR functions appear on program lines 16. The data appearing on lines 16 are used as inputs for various functions configured by AND gate elements in AND matrix 40. The results of the various AND and OR functions appear on array output lines 20. As in the embodiment shown in FIG. 1, program lines 16 are selectively enabled by switching transistors 22, in turn controlled by the contents of RAM 32. The output functions of the array can thus be varied.

The present invention has application as a configuration logic unit in a bit-slice microprocessor. For example, it may connect a 74AS888 CPU bit slice with a 74AS890 microsequencer. Both of these components are manufactured by Texas Instruments. The 74AS888 CPU slice has several output status lines, including N (arithmetic sign), Z (zero), OVR (overflow) and $C_{n+8}$ (carry over). These status lines serve as four of the input lines 14 to writable array logic unit 10 (SEE FIG. 1). An external condition line and an interrupt line serve as further input lines 14. There would be two output lines 20 to the 74AS890 microsequencer: CC, a condition code line, and INT, an interrupt line. Configuration control of unit 10 would be provided by data lines 36 and address lines 34.

The present invention may further be used in other systems that use logic. For example, the array of the invention can be used to design any computer function or registered arithmetic logic unit. The invention can be used to configure memory controls, error correction circuits, sequences, microsequences for timing systems, high-speed counters, lookup tables and state machines, among others. The invention may be applied to any system having two or more logic or memory matrices (such as PLAs, PROMs or EPROMs) connected by program lines.

In sum, an indefinitely reconfigurable logic array has been disclosed. The array can be reprogrammed very quickly, within the cycle time of its associated RAM. The array requires no special equipment to program, since the programming of the array is done by the software that runs the system into which it is incorporated. Certain originals programming errors may be easily fixed.

Although several embodiments of the invention have been illustrated in the accompanying drawings and described in the foregoing detailed description, it will be understood that the invention is not limited thereto but is capable of numerous rearrangements, modifications and substitutions without departing from the spirit and scope of the invention as set forth in the appended claims.

What is claimed is:

1. A writable logic array, comprising:
a first matrix of logic gates connected to a plurality of input lines and a plurality of program lines as its outputs;
a second matrix of logic gates receiving as inputs said program lines, said second matrix connected to a plurality of output lines; and
switches associated with said program lines for selectively enabling the communication of data from said first matrix to said second matrix; and
a random access memory coupled to said switches and programmable to select whether said switches will enable communication on respective program lines, such that output functions of said logic array may be altered according to which program lines are enabled.

2. The writable logic array of claim 1, wherein all gates in said first matrix perform the same basic logic function, all gates in said second matrix performing a second logic function different from said first basic logic function.

3. The writable logic array of claim 2, wherein said first and second matrices comprise product and summing gates, respectively.

4. The writable logic array of claim 1, wherein said switches each comprise a field effect transistor.

5. The writable logic array of claim 4, wherein said transistor has a current path and a control electrode, the current path connecting a respective one of said first output lines to ground, said control electrode coupled to a cell of said random access memory.

6. The writable logic array of claim 1, wherein said first matrix, said second matrix, said input and output lines and each said switch are incorporated into a single semiconductor chip.

7. The writable logic array of claim 6, wherein each said switches each comprise a metal-insulator-semiconductor transistor.

8. The writable logic array of claim 7, wherein said switches each comprise a complementary metal-insulator-semiconductor transistor.

9. A writable logic array, comprising:
a first matrix of gates that each perform a first basic operation, said gates programmed to perform a set of first logic functions, said first matrix having a plurality of program lines carrying outputs of said first logic functions;
a second matrix of gates that each perform a second basic operation different from said first basic operation, said program lines connected to inputs of said second matrix;
a plurality of switching transistors each having a current path and a control electrode, the current path of each switching transistor connecting a respective program line to ground, the control electrode of each switching transistor coupled to a respective output of a random access memory;
said random access memory writable to energize certain of said switching transistors to decouple respective first output lines from said second array.

10. The writable logic array of claim 9, wherein said first matrix is permanently programmed to perform a plurality of summing functions.

11. The writable logic array of claim 9, wherein said first matrix is permanently programmed to perform a plurality of product functions.

12. The writable logic array of claim 9, wherein said random access memory is a static random access memory.

13. The writable logic array of claim 9, wherein said random access memory is a dynamic random access memory.

14. A method for programming a logic array, comprising:
writing a set of programming instructions into a volatile random access memory;
selectively energizing a plurality of switches in response to the programming instructions;
enabling selected outputs of a first matrix of gates according to which of the switches are energized; and
receiving data on the enabled outputs as inputs into a second matrix of gates.

15. The method of claim 14, further including the step of:
writing the set of programming instructions during a boot-up phase of operation of the array.

16. The method of claim 14, further including the steps of:
operating the logic array as programmed by the set of programming instructions;
writing a further set of programming instructions into the volatile memory;
operating the logic array as reprogrammed with the further set of programming instructions; and
indefinitely repeating the last two steps using still further sets of instructions.

17. The method of claim 14, and further including the steps of:
programming the first matrix to perform a plurality of product functions, the output of each product function appearing on a respective program line;
programming the second matrix to perform a plurality of summing functions using as inputs, the program lines; and
writing the set of programming instructions to energize selected ones of the switches; and
disabling respective program lines associated with the selected ones, of the program lines, such that data cannot be transmitted from the first to the second matrix along the respective program lines.

18. The method of claim 14, further including the steps of:
programming the first matrix to perform a plurality of summing functions, the result of each summing function appearing on a respective program line;
programming the second matrix to perform a plurality of product functions, each product function using as its inputs a number of the program lines; and
writing the set of programming instructions to energize selected ones of the switches; and
disabling respective program lines associated with the selected ones of the program lines, such that data cannot be transmitted from the first to the second matrix along the respective program lines.

* * * * *